United States Patent
Naffziger et al.

(10) Patent No.: US 6,240,009 B1
(45) Date of Patent: May 29, 2001

(54) ASYMMETRIC RAM CELL

(75) Inventors: Samuel D. Naffziger; Donald R. Weiss, both of Ft Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/496,714

(22) Filed: Feb. 2, 2000

(51) Int. Cl.⁷ .................................................. G11C 11/00
(52) U.S. Cl. ......................... 365/154; 365/156; 257/903
(58) Field of Search ................................ 365/154, 156, 365/129; 257/903

(56) References Cited

U.S. PATENT DOCUMENTS

| | | | |
|---|---|---|---|
| 4,799,194 | * 1/1989 | Arakawa | 365/154 |
| 5,521,861 | * 5/1996 | Lee et al. | 365/156 |
| 5,774,393 | * 6/1998 | Kuriyama | 365/156 |
| 5,825,070 | * 10/1998 | Bryant et al. | 257/392 |
| 6,005,796 | * 12/1999 | Sywyk et al. | 365/156 |

* cited by examiner

Primary Examiner—David Nelms
Assistant Examiner—Hoai V. Ho

(57) ABSTRACT

A single-ended read, differential write CMOS SRAM cell has two inverters connected in a regenerative feedback circuit. Each inverter includes two complementary FETs. FETs of the same type in each inverter have differing gate widths and/or drive currents. The cell includes pass gate FETs having gate regions of approximately the same widths but differing lengths.

25 Claims, 4 Drawing Sheets

ASYMMETRIC RAM CELL

FIELD OF INVENTION

The present invention relates generally to complementary metal oxide semiconductor (CMOS) static random access memories (SRAM), and more particularly to a single-ended read, differential write CMOS, SRAM cell including two inverters connected in a regenerative feedback circuit, wherein each inverter includes a pair of complementary field effect transistors (FETs), and FETs of the same type in each inverter have differing gate region widths and/or drive currents.

BACKGROUND ART

FIG. 1 is a block diagram of a prior art CMOS SRAM 10 including many memory cells. Each cell contains a pair of inverters connected in a regenerative feedback circuit. Each of the inverters includes two complementary FETs. The cells of SRAM 10 are addressed by word write/read logic network 12, bit write logic network 14, and bit read logic network 16. Typically, SRAM 10 is a matrix of cells including M-words, each having N-bits, where M is 0, 1 . . . i . . . M, and N is 0, 1 . . . k . . . N; M and N are typically powers of two minus the quantity one, e.g., 255 and 1,023, respectively. Word write/read logic network 12 includes M output terminals, $word_0$, $word_1$ . . . $word_i$ . . . $word_M$, one of which is provided for each of the M words of SRAM 10. Bit write logic network 14 includes N complementary output terminals, $nbit_0$, $nbit_1$ . . . $nbit_k$ . . . $nbit_N$ and N non-complementary output bit terminals, $bit_0$, $bit_1$ . . . $bit_k$ . . . $bit_N$. Bit read logic network 16 includes N complementary input terminals, $nbit_0$, $nbit_1$ . . . $nbit_k$ . . . $nbit_N$ and N non-complementary input terminals, $bit_0$, $bit_1$ . . . $bit_k$ . . . $bit_N$. The nbit and bit terminals with corresponding numbers of bit write logic network 14 and bit write logic network 16 are connected to identical vertically extending lines (i.e., leads) in SRAM 10 with line numbers corresponding to the terminal numbers so that, e.g., the $nbit_k$ terminal of write logic network 14 and the $nbit_k$ terminal of bit read logic network 16 are connected to the $nbit_k$ line of SRAM 10, while $bit_k$ terminal of write logic network 14 and $bit_k$ terminal of read logic network 16 are connected to the $bit_k$ line of SRAM 10.

FIG. 2 is a circuit diagram of the structure included in each cell of SRAM 10. For purposes of illustration, FIG. 2 is considered to be the cell at $word_i$ $bit_k$. The cell of FIG. 2 includes two inverters 20 and 22, connected to each other in a regenerative, positive feedback circuit 24. Inverter 20 includes complementary P-channel transistor 26 and N-channel transistor 28 having source drain paths connected in series between the chip positive DC power supply voltage (+$V_{DD}$) and ground so that common drain terminals of FETs 26 and 28 are connected to terminal 30. Similarly, inverter 22 includes P-channel FET 32 and N-channel FET 34 having series connected source drain paths connected together between +$V_{DD}$ and ground so that FETs 32 and 34 have a common drain connection at terminal 36. The common drain terminal 30 of FETs 26 and 28 drives the gate electrodes of FETs 32 and 34 in parallel while the common drain terminal 36 of FETs 32 and 34 drives the gate electrodes of FETs 26 and 28 in parallel. Terminal 30 is selectively connected through the source drain path of N-channel pass gate FET 40 to $nbit_k$ line 42, while the source drain path of N-channel pass gate FET 44 selectively connects terminal 36 to $bit_k$ line 46. $Word_i$ line 48 drives the gate electrodes of FETs 40 and 44 in parallel.

The cell of FIG. 2 was originally designed for differential read, differential write operation but has more recently been proposed for single-ended read, differential write operation. The widths and lengths of the dielectric regions of the gates of N-channel FETs 28 and 34 are the same, while the widths and lengths of the dielectric regions of the gates of P-channel FETs 26 and 32 are the same. Consequently, the gate widths and drive currents of FETs 26 and 36 are the same, while the gate widths and drive currents of FETs 28 and 34 are the same. In addition, the gate widths and gate capacitances of FETs 40 and 44 are the same because the lengths and widths of the dielectric regions of FETs 40 and 44 are the same. In a prior art cell configuration, the gate widths of N-channel FETs 28 and 34 are 0.36 μm, the gate widths of P-channel FETs 26 and 32 are 0.32 μm, and the gate widths of FETs 40 and 44 are 0.28 μm and all of FETs 26, 28, 32, 34, 40 and 44 have gate lengths of 0.16 μm.

When the cell of FIG. 2 is written or read for single-ended operation, logic network 12 supplies a positive (+$V_{DD}$) voltage to line 48, while logic network 14 supplies signals to lines 42 and 46, and read logic network 16 supplies enable signals to its input terminals connected to lines 42 and 46 as follows. Prior to logic network 12 supplying the positive voltage to word line 48, write logic network 14 precharges one of nbit line 42 or bit line 46 to the positive voltage. To write a binary one into the cell of FIG. 2 logic network 14 reduces the voltage on nbit line 42 to ground but precharges the voltage on bit line 46 high prior to logic network 12 applying a high voltage to word line 48. FETs 40 and 44 are enabled by the positive voltage on line 48 to pass the low and high voltages on lines 42 and 46 to terminals 30 and 36. The low and high voltages at terminals 30 and 36 cause turn on of FETs 28 and 32 and turn off of FETs 26 and 34. Because of the regenerative connections of inverters 20 and 22, FETs 28 and 32 stay on and FETs 26 and 34 stay off and the voltages at terminals 30 and 36 respectively remain low and high after logic network 12 reduces the voltage on word line 48 to turn off FETs 40 and 44. Similarly, but in an opposite manner, logic network 14 writes a binary zero into the cell of FIG. 2 by applying high and low precharge voltages to lines 42 and 46, causing turn on of FETs 26 and 34 and turn off of FETs 28 and 32 in response to a positive voltage on write line 48. Hence, terminals 30 and 36 are at high and low voltages as a result of the positive voltage on line 48.

To read the binary value the cell of FIG. 2 stores, read logic network 16 samples the voltage at terminal 36 by enabling an input terminal of a detection circuit (not shown) of the read logic network after line 46 has been precharged to a high (i.e., positive) voltage and while word write/read logic network 12 applies a high voltage to line 48. If the cell of FIG. 2 is storing a bit causing terminals 30 and 36 to be respectively at high and low voltages, the low voltage at terminal 36 pulls down the voltage on line 46 when the positive voltage on line 48 turns on FET 44. The high voltage at terminal 36 causes line 46 to stay at a high voltage when the positive voltage on line 48 turns on FET 44. The detection circuit connected to line 46 senses the low and high voltages on line 46 to indicate the binary value the cell of FIG. 2 stores.

Because the memory of FIG. 1 and the cell of FIG. 2 are read on a single ended basis, the voltage variations of pulses on nbit line 42 during a read operation are not detected by bit read logic network 16. Consequently, a slow slew rate on nbit line 46 does not have a particularly adverse effect on read operations of the memory of FIG. 1 and the cell of FIG. 2. (Slew rate is the time rate of change of the voltage of leading edges of the pulses.)

FIG. 3 is a top view of the actual physical layout of the cell schematically illustrated in FIG. 2. The cell of FIG. 3 is approximately rectangular, having a width of 2.22 μm, and a length of 2.52 μm., i.e., the distance between parallel sides 50 and 52 is 2.22 μm, while the distance between parallel sides 54 and 56, which extend at right angles to sides 50 and 52, is 2.52 μm.

SUMMARY OF THE INVENTION

It is an object of the present invention to provide a new and improved SRAM cell.

An added object is to provide a new and improved SRAM having cells which are read by single-ended techniques.

Another object of the invention is to provide a new and improved SRAM cell that is read by single-ended techniques and has a smaller area than prior art SRAM cells.

An additional object of the invention is to provide a new and improved single-ended read SRAM cell having a faster bit slew read rate than prior art single-ended read SRAM cells.

A further object of the invention is to provide a new and improved SRAM having reduced access delay so it is capable of higher frequency operation read by single-ended techniques having a high bit line slew rate.

We have realized the performance of the cell illustrated in FIG. 2, when operated as described for differential write and single-ended read, can be improved to have a high read slew rate by changing the gate widths (i.e., the width of an oxide layer between the FET gate electrode and the semiconductor body including the FET source and drain electrodes) of FETs 28 and 34 so they are not the same. We have found that the size of the cell can be reduced with such a change. In particular, we realized the performance of the cell illustrated in FIG. 2 can be improved by making the gate width of FET 34 greater than the gate width of FET 28. In coming to this conclusion, we realized that for differential write and single-ended read, the slew of pulses used to read the voltage stored at terminal 30 is not important but that the slew rate of pulses used to read the voltage stored at terminal 36 is important. This is because no read operation is performed for the voltage stored at terminal 30 in the single-ended read mode. Increasing the gate width of FET 34 and decreasing the width of FET 28 causes the drive current of FET 34 to be greater than the drive current of FET 28 as well as greater than that of the prior art symmetric cell, i.e., greater current flows from the source to the drain of FET 34 than flows from the source to the drain of FET 28. A lower impedance is thereby established between bit line 46 and ground through the source drain path of FET 44 and the source drain path of FET 34 than between nbit line 42 and ground through the source drain paths of FETs 40 and 28. The faster slew rate of bit line 46 means higher frequency operation, i.e., lower SRAM access delay, than during a read operation with the prior art cell. The lower SRAM access delay enables a greater number of rows in SRAM matrix 10 to be accessed during a read operation in the same time period as the prior art, to thereby provide greater cell density.

The above and still further objects, features and advantages of the present invention will become apparent upon consideration of the following detailed description of a specific embodiment thereof, especially when taken in conjunction with the accompanying drawings.

DESCRIPTION OF THE PREFERRED EMBODIMENT

Figure 1:
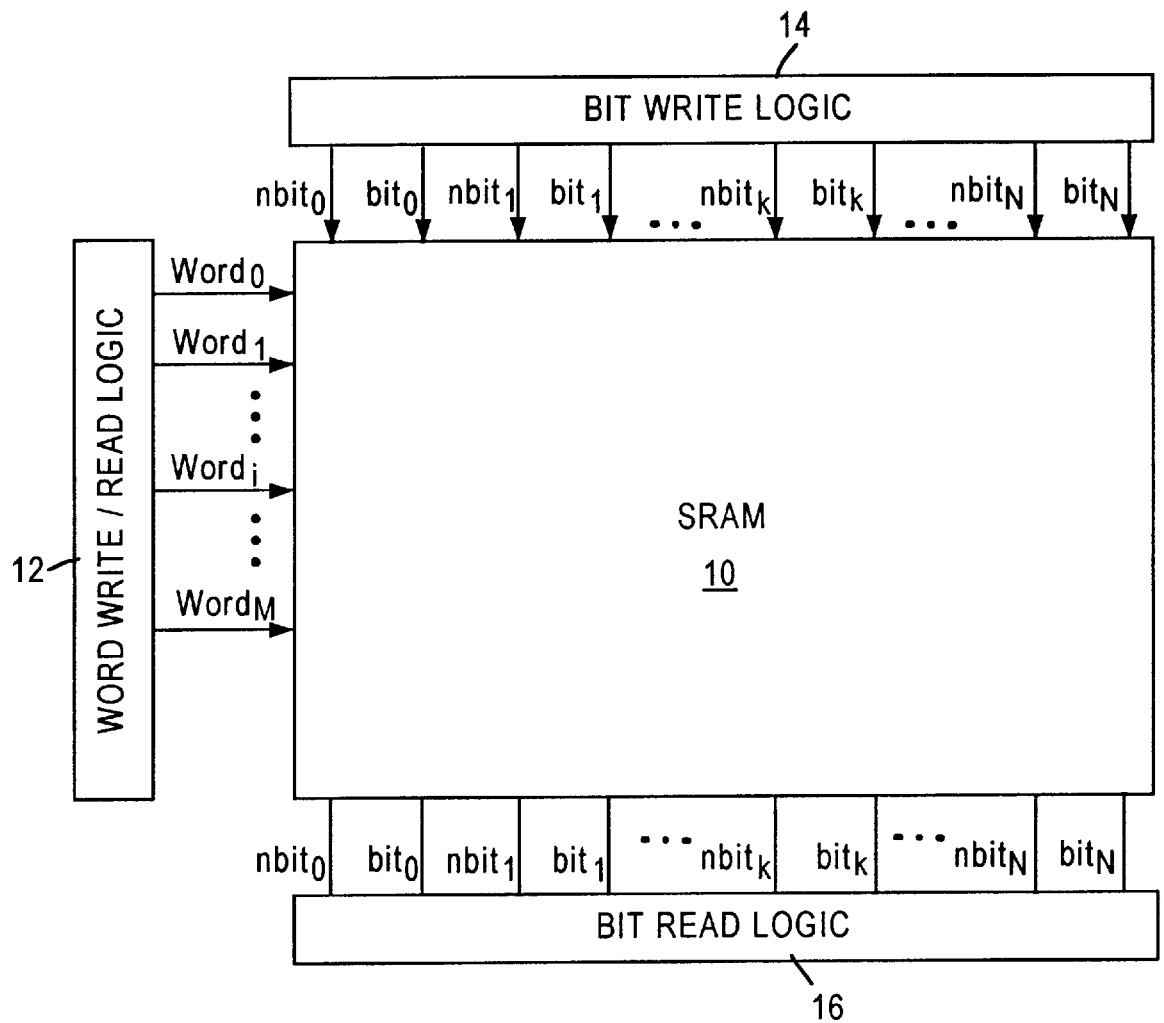
FIG. 1, as described, is a block diagram of a prior art SRAM memory system.
Figure 2:
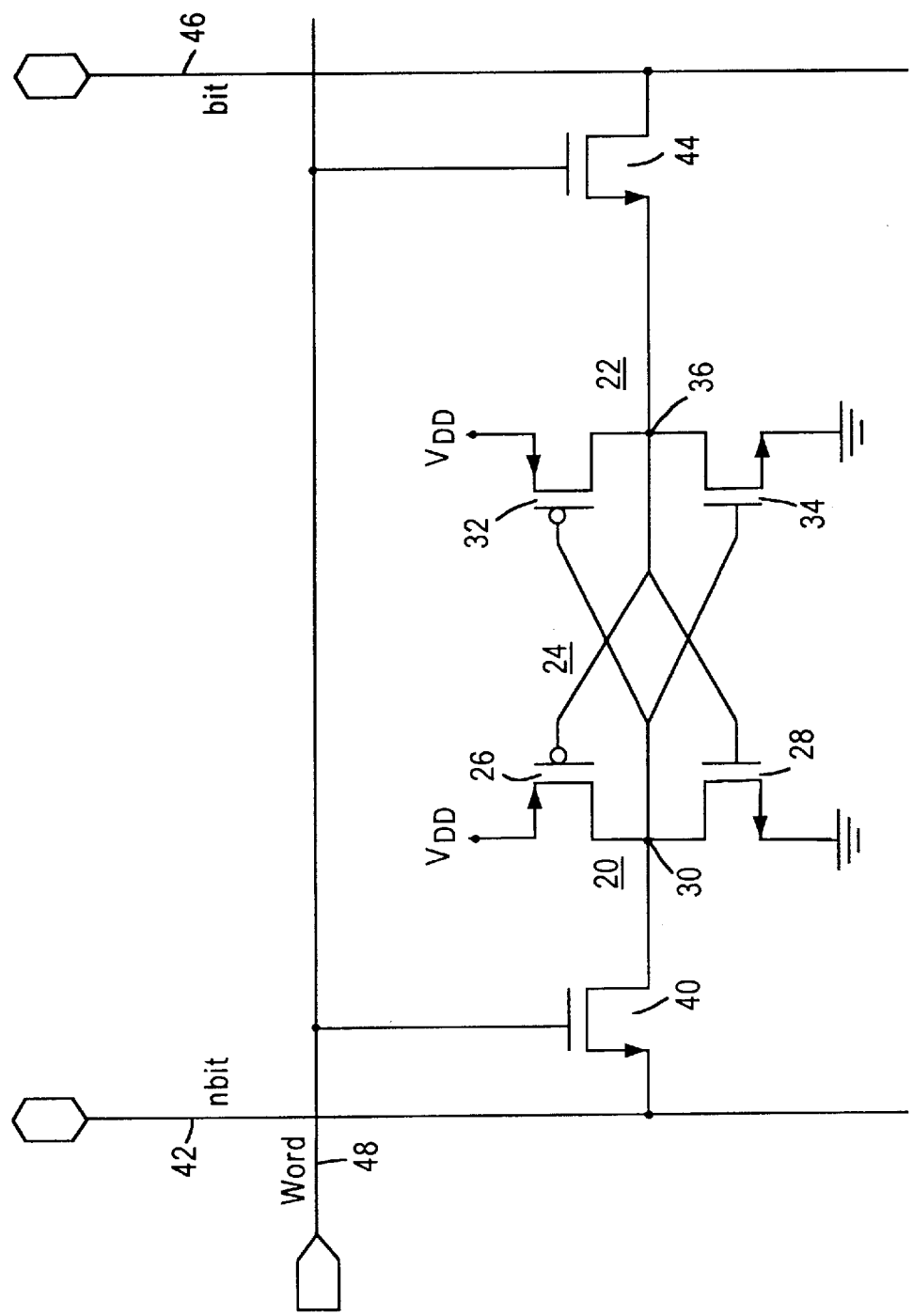
FIG. 2 is a schematic circuit diagram of a cell included in the prior art SRAM memory.

The SRAM cell of the preferred embodiment of the present invention has the same schematic circuit diagram as the prior art SRAM cell illustrated in FIG. 2. Consequently, there is no need for another figure that is a schematic circuit diagram of the SRAM cell of FIG. 2. The SRAM cell of the preferred embodiment of the present invention differs from the prior art SRAM cell because the widths of the gates and the gate capacitances of the N-channel FETs 28 and 34 differ from each other, rather than being the same as in the prior art. In addition, the widths of the gates and the gate capacitances of the P-channel FETs 26 and 32 differ from each other. In the preferred embodiment the gate widths of FETs 26 and 28 of inverter 20 are the same and the gate width of FET 34 is greater than the gate width of FET 32 of inverter 22. In the preferred embodiment, the gate widths of FETs 26, 28, 40 and 44 are all equal to each other .

In the preferred embodiment, the cell of FIG. 2, as modified in the above description, is driven by pulses derived from a 500 MHz clock. The 500 MHz clock drives word write/read logic circuit 12, bit write logic network 14, and read logic circuit 16 for differential write, single-ended read. The lengths of FETs 26, 28, 32, 36 and 44 are the same (0.16 nanometers), the length of FET 40 is 0.26 micrometers and the widths of these FETs of the preferred embodiment of the cell are as follows:

TABLE 1

| FET | Gate Width (Micrometer) |
|---|---|
| 26 | 0.26 |
| 28 | 0.26 |
| 32 | 0.42 |
| 34 | 0.46 |
| 40 | 0.26 |
| 44 | 0.26 |

Hence, in the preferred embodiment, the widths of the gates of FETs 32 and 34 are respectively 1.615 and 1.769 times the width of the gates of FETs 26 and 28.

Because the gate of FET 34 of the present invention has a larger width and therefore larger drive current than the gate of the prior art FET 34, FET 34 of the present invention presents a lower source drain impedance between terminal 36 and ground when a positive voltage is applied to word line 46. The increases in the gate widths of FETs 32 and 34 over the prior art are more than offset, for cell area purposes, by the decreases in the gate widths of FETs 26 and 28. Hence, as pointed out above, the area of a cell in accordance with a preferred embodiment of the present invention is less than that of the prior art.

The aforementioned values of the gate lengths and Table 1 gate widths of FETs 26, 28, 32, 34, 40 and 44 enable inverters 20 and 22 of a cell of SRAM 10 to have approximately the same threshold values as the prior art SRAM cell. Consequently, no re-design of circuits 12, 14 and 16 is necessary to accommodate the asymmetrical cell design.

The aforementioned gate lengths and the gate widths of Table 1 enable FETs 26, 28, 32 and 34 to store voltages that are applied to them during write operations, i.e., cause FETs 26, 28, 32 and 34 in the regenerative feedback network 24 to remain in the same stable state between write operations.

N-channel FET 34 is approximately 2.5 times as strong as P-channel FET 32, i.e., when on, FET 34 supplies a current to terminal 36 that is about 2.5 times the current FET 32, when on, supplies to terminal 36. This greater strength of FET 34 over FET 32, in combination with the wider width of the gate of FET 34 relative to that of FET 32 causes the threshold voltage of inverter 22 to be substantially less than 0.5 $V_{DD}$, and equal to approximately 0.25 $V_{DD}$. The threshold voltage of inverter 20 is approximately 0.3 $V_{DD}$ because of the greater strength of N-channel FET 28 than P-channel FET 26. These threshold voltages of inverter 20 and 22 of the FETs of Table 1 are about the same as the threshold voltages of the prior art cell.

There is a trade-off between the size and speed of a cell of the type illustrated in FIG. 2. For the asymmetric cell of Table 1, the read delay is about 85% that of the symmetric design; the area of the asymmetric cell of Table 1 is 96% that of the symmetric design. However, in other situations, where cell speed is more important than cell area, the read delay can be decreased further by increasing the width of N-channel FET 34 relative to the width of N-channel FET 28. The slew rate of FETs 26 and 28 of inverter 20 is not particularly important because read logic circuit 16 never responds to the voltage on nbit line 42.

The results attained by the asymmetrical arrangement of Table 1 cannot be obtained merely by increasing the gate width of FET 34, without changing the geometry of other FETs in the cell. If the gate width of FET 34 were increased without a reduction of the gate width of FET 28, the cell of FIG. 2 would have a larger area which is obviously undesirable for integrated circuit packing density purposes. Reducing the gate width of FET 28 reduces the cell area but could cause the cell to be unstable during read operations if pass gate FETs 40 and 44 supply the same currents to nodes 30 and 36 during write operations. The instability occurs because the narrow gate of FET 28 cannot handle the same relatively large current that the wider gate of FET 34 can handle. To reduce the gate drive current of FET 28 when a positive voltage is on nbit line 42 and FET 40 is open during a write operation, the gate length of FET 40 is greater than that of FET 44, as previously specified.

Instability could also occur if no other FET geometry changes are made, because the trip, i.e., threshold, voltages of inverters 20 and 22 would be changed so that a low voltage at terminal 36 could not be maintained between write operations, particularly during a read operation of line 46. If the width of the gate of FET 28 were to stay the same as in the prior art or if it were increased to be substantially the same as the increased gate width of FET 34, the voltage at the gate of FET 28 would increase excessively fast during a read operation when the cell stores a low voltage.

When the cell with the gate widths of Table 1 stores a low voltage, FETs 28 and 32 are off and FETs 26 and 34 are on, causing terminals 30 and 36 to be at approximately +$V_{DD}$ and ground respectively. When the cell is read, the positive voltage on word line 48 turns on FET 44 causing the high precharge voltage on bit line 46 to be coupled to terminal 36. With the gate width values of Table 1, the stored low voltage at terminal 36 and the source drain impedance of FET 34 reduce the precharge high voltage on bit line 46 to a low voltage that the detector of read logic circuit 16 connected to bit line 46 senses.

If, however, the gate width and length of FET 40 had been at the prior art values of 0.28 and 0.20 micrometers or had the same 0.26 and 0.16 micrometer values as the gate width and length of FET 44, the high precharge voltage that FET 40 couples from line 42 to terminal 30 may have turned on FET 34. Turn on of FET 34 may have occurred in this circumstance because the large gate width and drive current of FET 40 would have caused the voltage at terminal 30 to have changed from a low to a high value to turn on FET 34 and turn off FET 32. The resulting low voltage at terminal 36 would have turned on FET 26 and turned off FET 28 to a greater extent. Consequently, the voltage at terminal 36 would have gone lower. Due to the regenerative action of inverters 20 and 22, the voltage at terminal 36 would have quickly gone substantially to ground. Hence, the cell state would have been changed until the next cell write operation occurs. The +$V_{DD}$ voltage that would have been coupled to bit line 46 would now be ground and the detection circuit of read logic network 16 connected to the bit line would have incorrectly pulled the bit line to ground and incorrectly read the stored cell bit as a binary zero value.

When the cell with the gate widths of Table 1 stores a high voltage, FETs 28 and 32 are on and FETs 26 and 34 are off, causing terminals 30 and 36 to be at approximately ground and +$V_{DD}$ respectively. When the cell is read, the positive voltage on word line 48 turns on FET 44 but the high voltage at terminal 36 has no effect on the high precharge voltage on bit line 46. The stored high voltage at terminal 36 is sensed by the detector of read logic circuit 16 connected to bit line 46.

Figure 3:
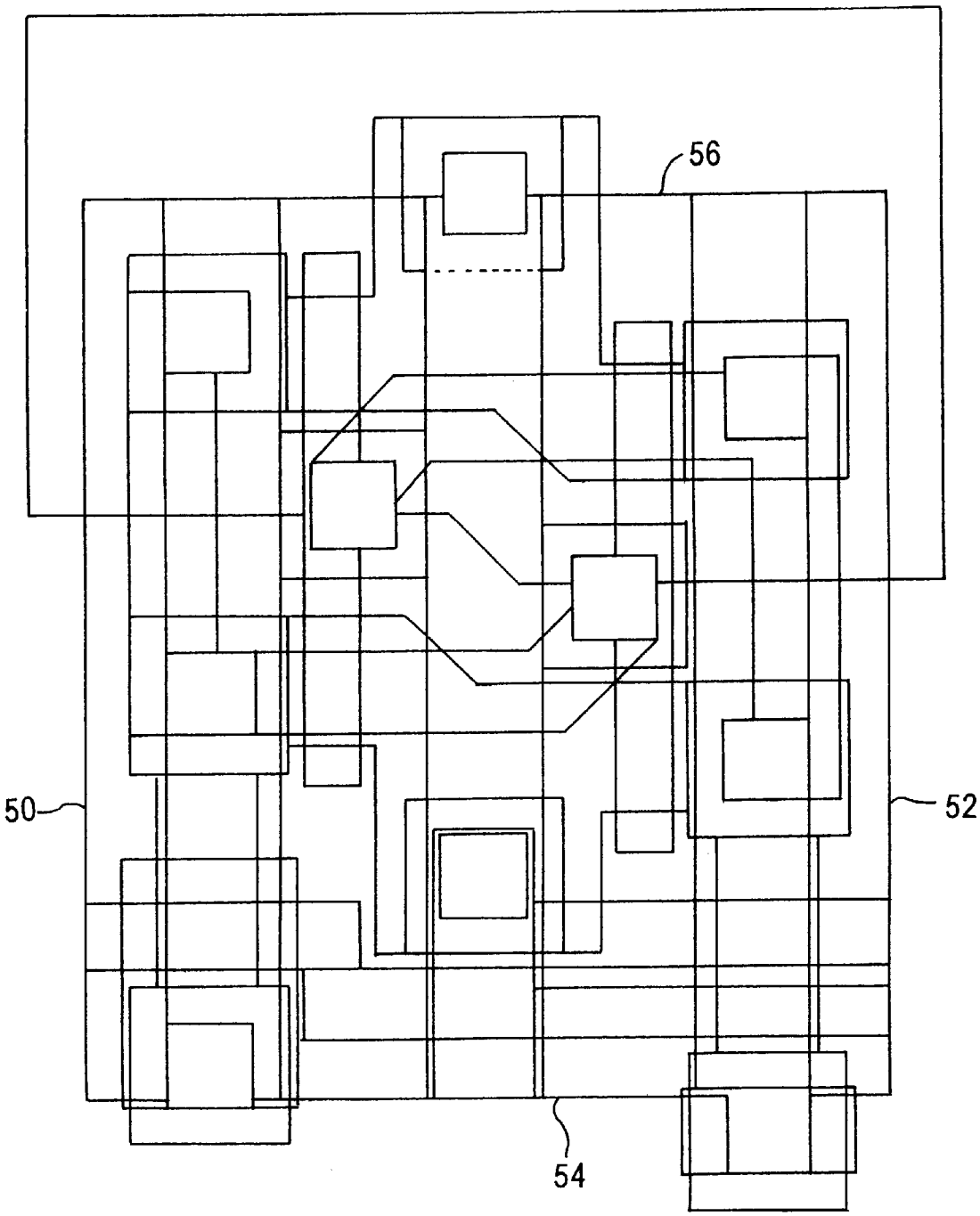
FIG. 3 is a top view of the cell schematically illustrated in FIG. 2.
Figure 4:
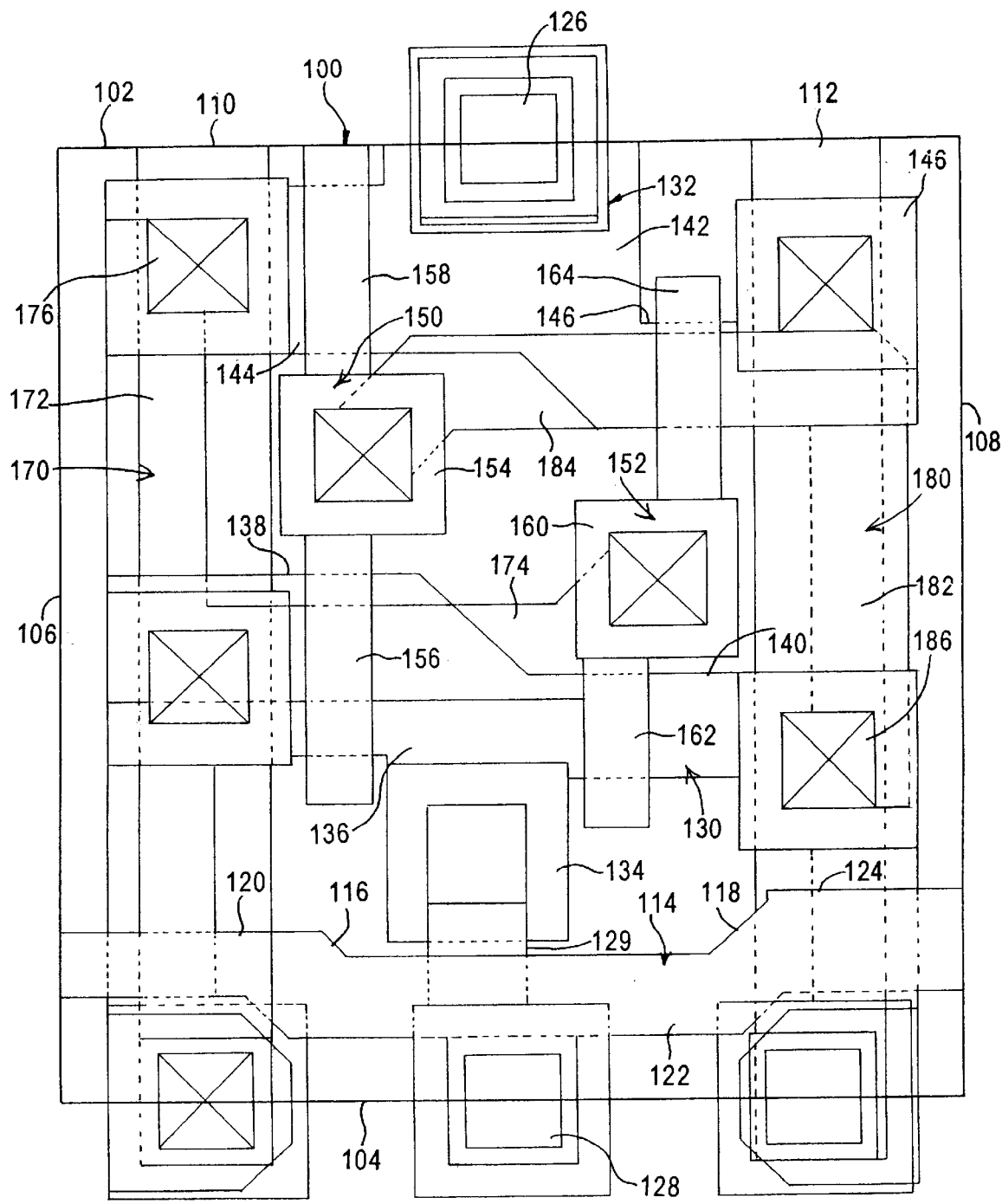
FIG. 4 is a top view of an SRAM cell including a pair of inverters with like conductivity type FETs having differing gate widths and capacitance.

FIG. 4 is a layout diagram of cell 100 including the circuit elements of FIG. 2 with the gate widths of Table 1. Cell 100 has a rectangular shape, including top and bottom straight edges 102 and 104 which are at right angles to straight side edges 106 and 108. Each of edges 102 and 104 has a length of 2.22 micrometers, while each of edges 106 and 108 has a length of 2.42 micrometers. Thus, cell 100 of FIG. 4 has an area of 5.37 square micrometers which is 0.96 times the 5.59 square micrometers area of the prior art cell of FIG. 3, i.e., the cell of FIG. 4 is approximately 4% smaller than the cell of FIG. 3.

Cell 100 includes metal strips 110 and 112 which respectively correspond with nbit line 42 and bit line 46 and extend parallel to and in close proximity with edges 106 and 108, from top edge 102 to bottom edge 104. Polystrip 114, which corresponds with word line 48, extends between side edges 106 and 108, in close proximity to bottom edge 104. Strip 114 includes straight portions 120, 122 and 124 that extend parallel to edges 102 and 104, portions 120, 122 and 124 are respectively close to edge 106, in the cell center, and close to edge 108.

Portions 120 and 124 are substantially aligned and equispaced from bottom edge 104, while portion 122 is closer to edge 104 than portions 120 and 124. Strip 114 includes diagonal portions 116 and 118 respectively connecting straight portions 120 and 122 and portions 122 and 124. FETs 40 and 44, respectively at the intersections of strips 110 and 114 and strips 112 and 114, have the usual multilayer configuration forming source, drain and gate electrodes and an oxide layer.

Terminals 126 and 128, respectively intersecting the center portions of top and bottom edges 102 and 104, supply the chip +$V_{DD}$ and ground power supply voltages to cell 100 and to the cells of SRAM 10 abutting top and bottom edges 102 and 104. Metal strip 129, having opposite ends connected to ground terminal 128 and diffusion conductor layer 130, supplies the ground voltage at terminal 128 to the various elements in cell 100 via layer 130. Diffusion conductor layer 132, connected to +$V_{DD}$ terminal 126, supplies the +$V_{DD}$ power supply voltage at terminal 126 to the various elements in cell 100. Layer 130 includes central segments 134 and 136, as well as finger segments 138 and 140 that extend from the central segment 136 to an overlapping relation with strips 110 and 112 respectively; segment 134 contacts layer 129. Layer 132 includes central segment 142 and finger segments 144 and 146 that extend from central segment 142 to an overlapping relation with strips 110 and 112, respectively.

N- and P-type doped layers 150 and 152 extend generally parallel to edges 106 and 108, with strip 110 interposed between layer 150 and edge 106 and strip 112 interposed between layer 152 and edge 108. N-layer 150 includes central, contact portion 154 and strips 156 and 158 that respectively extend from contact 154 toward bottom edge 104 and from contact 154 to upper edge 102. P-layer 152 includes central, contact portion 160 and strips 162 and 164 that respectively extend from contact 160 toward bottom edge 104 and from contact 160 toward top edge 102.

Strip 156 of layer 150 and finger segment 138 of diffusion conductor layer 130 overlap between strip 110 and the center line of cell 100 that extends through terminals 126 and 128 to form N-channel FET 34. Strip 158 of layer 150 and finger segment 144 of diffusion conductor layer 132 overlap between the cell center line and strip 110 to form N-channel FET 28. Strip 162 of layer 152 and finger segment 140 of layer 130 overlap to form P-channel FET 32, while the overlapping segments of strip 164 and finger segment 146 of layer 142 define P-channel FET 32. Metal strip 170, including vertically and horizontally extending portions 172 and 174, connects contact 160 to +$V_{DD}$ via contact 176 and diffusion conductor layer 132, in turn connected to +$V_{DD}$ terminal 126. Metal strip 180, including vertically and horizontally extending portions 182 and 184, connects contact 154 to ground via contact 186 and diffusion conductor layer 130, in turn connected to ground contact 128 via metal strip 129. Other conducting layers within the confines of cell 100 connect the various electrodes of FETs 26, 28, 32, 34, 40 and 44 together to achieve the circuit configuration schematically illustrated in FIG. 2, with the gate widths of Table 1.

The 4% area reduction of the cell illustrated in FIG. 4 relative to the area of the prior art cell, as illustrated in FIG. 3, is significant in terms of integrated circuit chip geometry. The smaller size cell of FIG. 4 also is a secondary factor in providing faster operation, which is attained primarily by the asymmetrical gate widths of N-channel FETs 28 and 34 and P-channel FETs 26 and 32.

While there has been described and illustrated a specific embodiment of the invention, it will be clear that variations in the details of the embodiment specifically illustrated and described may be made without departing from the true spirit and scope of the invention as defined in the appended claims.

We claim:

1. A static single-ended read, differential write random access memory cell comprising bit and nbit lines and a word line, the cell being arranged to be read by enabling the bit line while a voltage of predetermined polarity is applied to the word line and to have a bit written in it by applying only complementary voltages to the bit and nbit lines while the voltage of predetermined polarity is applied to the word line, first and second inverters connected to each other to form a regenerative feedback circuit, each of the inverters including first and second field effect transistors of complementary conductivity types, gate electrodes of the field effect transistors of the first inverter being selectively connected to the bit line in response to the voltage of predetermined polarity being applied to the word line, gate electrodes of the field effect transistors of the second inverter being connected to the nbit line in response to the voltage of predetermined polarity being applied to the word line, each of the gate electrodes being associated with a metal oxide gate region, the gate region of the first field effect transistor of the first inverter having a width that is substantially larger than the gate region of the first field effect transistor of the second inverter, the first field effect transistors of the first and second inverters being of the same conductivity type.

2. The static random access memory cell of claim 1 wherein many of said cells are included in a memory having many of said bit, nbit and word lines, and further including many sources for applying the complementary voltages to the many bit and nbit lines so that during each write operation for a particular cell there are only complementary voltages applied to each of the bit and nbit lines of the particular cell.

3. The static random access memory cell of claim 2 wherein the gate region of the field effect transistor of the second conductivity type of the first inverter has a width that is substantially larger than the gate region of the field effect transistor of the second conductivity type of the second inverter.

4. The static random access memory cell of claim 3 wherein the gate region widths of the transistors of the second inverter are approximately the same.

5. The static random access memory cell of claim 4 wherein each of the first field effect transistors is an N-channel field effect transistor, the first field effect transistor of the first inverter having a greater gate region width than any of the other field effect transistors of the first and second inverters.

6. The static random access memory cell of claim 5 wherein the second field effect transistor of the first inverter is a P-channel field effect transistor having a greater gate region width than all the transistors of the second inverter.

7. The cell of claim 6 further including first and second additional field effect transistors respectively having source drain paths, the first additional field effect transistor source drain path being connected between the bit line and the gate electrodes of the first and second field effect transistors of the first inverter, the second additional field effect transistor source drain path being connected between the nbit line and the gate electrodes of the first and second field effect transistors of the second inverter, each of the additional field effect transistors having a gate electrode connected to the word line, the second additional field effect transistor having a length greater than that of the first additional field effect transistor.

8. The static random access memory cell of claim 7 wherein the first and second additional field effect transistors have approximately the same gate region widths, equal approximately to the gate region width of each of the first and second transistors of the second inverter.

9. The static random access memory cell of claim 1 wherein the gate region of the field effect transistor of the second conductivity type of the first inverter has a width that is substantially larger than the gate region width of the field effect transistor of the second conductivity type of the second inverter.

10. The static random access memory cell of claim 1 wherein the gate region widths of the first and second transistors of the second inverter are approximately the same.

11. The static random access memory cell of claim 1 wherein the first field effect transistor of each inverter is an N-channel field effect transistor, the first field effect of the first inverter having a greater gate region width than any of the other first and second field effect transistors of the first and second inverters.

12. The static random access memory cell of claim 1 wherein the second field effect transistor of the first inverter is a P-channel field effect transistor having a greater gate region width than the first and second transistors of the second inverter.

13. The cell of claim 1, wherein the complementary field effect transistors of each inverter have (a) source drain paths connected in series across a pair of DC power supply terminals, and (b) a common terminal for drains of the first and second complementary field effect transistors, the gate electrodes of the complementary transistors of the first inverter being connected to the common terminal for the drains of the second inverter, the gate electrodes of the complementary transistors of the second inverter being connected to the common terminal for the drains of the first inverter, the connections of the gate electrodes and drains of the first and second inverters being included in the regenerative feedback circuit.

14. The cell of claim 13 further including first and second additional field effect transistors respectively having source drain paths, the first additional field effect transistor source drain path being connected between the bit line and the gate electrodes of the first and second field effect transistors of the first inverter, the second additional field effect transistor source drain path being connected between the nbit line and the gate electrodes of the first and second field effect transistors of the second inverter, each of the additional field effect transistors having a gate electrode connected to the word line, the second additional field effect transistor having a length greater than that of the first additional field effect transistor.

15. The static random access memory cell of claim 14 wherein the first and second additional field effect transistors have approximately the same gate region widths.

16. The static random access memory cell of claim 14 wherein the first and second additional field effect transistors have approximately the same gate-region widths, equal approximately to the gate region width of each of the first and second transistors of the second inverter.

17. The cell of claim 1 further including first and second additional field effect transistors respectively having source drain paths, the first additional field effect transistor source drain path being connected between the bit line of the gate electrodes of the first and second field effect transistors of the first inverter, the second additional field effect transistor source drain path being connected between the nbit line and the gate electrodes of the first and second field effect transistors of the second inverter, each of the additional field effect transistors having a gate electrode connected to the word line.

18. The cell of claim 17 wherein the additional field effect has a length greater than the first additional field effect transistor length.

19. The static random access memory cell of claim 1 wherein the first and second additional field effect transistors have approximately the same gate region widths.

20. The static random access memory cell of claim 1 wherein the first and second additional field effect transistors have approximately the same gate region widths, equal approximately to the gate region widths of the first and second transistors of the second inverter.

21. The static random access memory cell of claim 1 wherein the cell includes only one word line for simultaneously enabling the gate electrodes of the field effect transistors of the first and second inverters to be responsive to the complementary voltages of the bit and nbit lines while the predetermined voltage is applied to the word line.

22. A static single-ended read, differential write random access memory cell comprising bit and nbit lines and a word line, the cell being arranged to be read by enabling the bit line while a voltage of predetermined polarity is applied to the word line and to have a bit written in it by applying only complementary voltages to the bit and nbit lines while the voltage of predetermined polarity is applied to the word line, first and second inverters connected to each other to form a regenerative feedback circuit, each of the inverters including first and second field effect transistors of complementary conductivity types, gate electrodes of the field effect transistors of the first inverter being selectively connected to the bit-line in response to the voltage of predetermined polarity being applied to the word line, gate electrodes of the field effect transistors of the second inverter being connected to the nbit line in response to the voltage of predetermined polarity being applied to the word line, the first field effect transistor of the first inverter having a drive current that is substantially larger than the drive current of the first field effect transistor of the second inverter, the first field effect transistors of the first and second inverters being of the same conductivity type.

23. The static random access memory cell of claim 22 further including first and second additional field effect transistors respectively having source drain paths, the first additional field effect transistor source drain path being connected between the bit line and the gate electrodes of the first and second field effect transistors of the first inverter, the second additional field effect transistor source drain path being connected between the nbit line and the gate electrodes of the first and second field effect transistors of the second inverter, each of the additional field effect transistors having a gate electrode connected to the word line, the second additional field effect transistor having a length greater than that of the first additional field effect transistor.

24. The static random access memory cell of claim 22 wherein many of said cells are included in a memory having many of said bit, nbit and word lines, and further including many sources for applying the complementary voltages to the many bit and nbit lines so that during each write operation for a particular cell there are only complementary voltages applied to each of the bit and nbit lines of the particular cell.

25. The static random access memory cell of claim 22 wherein the cell includes only one word line for simultaneously enabling the gate electrodes of the field effect transistors of the first and second inverters to be responsive to the complementary voltages of the bit and nbit lines while the predetermined voltage is applied to the word line.

* * * * *